(12) United States Patent
Baier et al.

(10) Patent No.: US 10,673,160 B2
(45) Date of Patent: Jun. 2, 2020

(54) CIRCUIT BOARD ASSEMBLY

(71) Applicant: Lear Corporation, Southfield, MI (US)

(72) Inventors: Ralf Baier, Marktrodach (DE); Claus Brendel, Kronach (DE); Udo Angermueller, Kronach (DE); Andy Mantey, Kronach (DE)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/725,588

(22) Filed: Oct. 5, 2017

(65) Prior Publication Data
US 2018/0102601 A1 Apr. 12, 2018

(30) Foreign Application Priority Data

Oct. 6, 2016 (DE) .................... 20 2016 105 563 U

(51) Int. Cl.
*H01R 12/72* (2011.01)
*H01R 12/58* (2011.01)
*H05K 1/18* (2006.01)
*H01R 12/70* (2011.01)
*H01R 12/71* (2011.01)
*H05K 1/05* (2006.01)

(52) U.S. Cl.
CPC .......... *H01R 12/727* (2013.01); *H01R 12/58* (2013.01); *H01R 12/7035* (2013.01); *H01R 12/7047* (2013.01); *H01R 12/716* (2013.01); *H01R 12/724* (2013.01); *H05K 1/056* (2013.01); *H05K 1/184* (2013.01); *H05K 2201/10189* (2013.01); *H05K 2201/10303* (2013.01)

(58) Field of Classification Search
CPC .............. H01R 12/727; H01R 12/7035; H01R 12/7047; H01R 12/724; H01R 12/58
USPC .......................................... 439/78, 82, 83, 85
See application file for complete search history.

(56) References Cited

U.S. PATENT DOCUMENTS

| 3,745,510 | A | * | 7/1973 | Mallon | ................ | H05K 1/0263 |
| | | | | | | 439/171 |
| 4,243,289 | A | | 1/1981 | Kozel | | |
| 4,386,815 | A | | 6/1983 | Carter et al. | | |
| 4,479,686 | A | * | 10/1984 | Hoshino | .............. | H01R 12/716 |
| | | | | | | 439/544 |
| 4,491,376 | A | | 1/1985 | Gladd et al. | | |
| 4,884,335 | A | | 12/1989 | McCoy et al. | | |
| 4,914,062 | A | | 4/1990 | Voltz | | |
| 5,169,322 | A | * | 12/1992 | Frantz | ................... | H01R 12/716 |
| | | | | | | 439/378 |
| 5,199,884 | A | * | 4/1993 | Kaufman | ............. | H01R 12/716 |
| | | | | | | 439/566 |
| 5,632,628 | A | * | 5/1997 | Wagner | ................ | G11B 33/122 |
| | | | | | | 439/271 |
| 5,685,726 | A | * | 11/1997 | Lwee | ................... | H01R 12/716 |
| | | | | | | 439/554 |

(Continued)

*Primary Examiner* — Edwin A. Leon
*Assistant Examiner* — Milagros Jeancharles
(74) *Attorney, Agent, or Firm* — Fishman Stewart PLLC

(57) ABSTRACT

The present disclosure includes a circuit board assembly that may include a circuit board that may include an aperture. The circuit board assembly may include a reverse header. The reverse header may include a base and a plurality of pins connected to the base. A portion of each of the plurality of pins may be disposed at least partially in the aperture. The circuit board may be configured an insulated metal substrate circuit board.

19 Claims, 10 Drawing Sheets

(56) References Cited

U.S. PATENT DOCUMENTS

| | | | |
|---|---|---|---|
| 5,785,536 A * | 7/1998 | McCartin | H01R 12/57 439/374 |
| 5,823,799 A | 10/1998 | Tor et al. | |
| 5,919,051 A * | 7/1999 | Mitra | H01R 12/716 439/74 |
| 5,961,339 A * | 10/1999 | Koopman | H01R 12/7052 439/378 |
| 6,077,093 A | 6/2000 | Seong et al. | |
| 6,287,130 B1 * | 9/2001 | Torii | H01R 12/707 439/83 |
| 6,736,651 B2 | 5/2004 | Ho | |
| 6,773,272 B2 | 8/2004 | Koehler et al. | |
| 6,988,900 B1 * | 1/2006 | Meister | H01R 12/716 438/544 |
| 7,074,054 B2 * | 7/2006 | Mertz | H01R 9/24 439/78 |
| 7,850,466 B2 * | 12/2010 | Mostoller | H01R 12/57 439/83 |
| 7,922,509 B2 * | 4/2011 | Weber | H01R 12/57 439/221 |
| 8,123,534 B1 | 2/2012 | Herring et al. | |
| 8,179,631 B2 * | 5/2012 | Aoyagi | G11B 33/08 360/97.11 |
| 8,714,990 B2 * | 5/2014 | Naito | H01R 12/714 439/78 |
| 9,407,020 B2 * | 8/2016 | Gao | H01R 12/7082 |
| 9,825,383 B2 * | 11/2017 | Xiao | H01R 12/707 |
| 9,859,638 B2 * | 1/2018 | Fu | H01R 4/4827 |
| 2002/0111064 A1 * | 8/2002 | Kohno | H01R 12/716 439/547 |
| 2004/0102065 A1 * | 5/2004 | Obikane | H01R 12/716 439/74 |
| 2008/0024908 A1 * | 1/2008 | Nakamiya | G11B 25/043 360/97.22 |
| 2013/0330941 A1 * | 12/2013 | Jeon | H01R 12/585 439/65 |

* cited by examiner

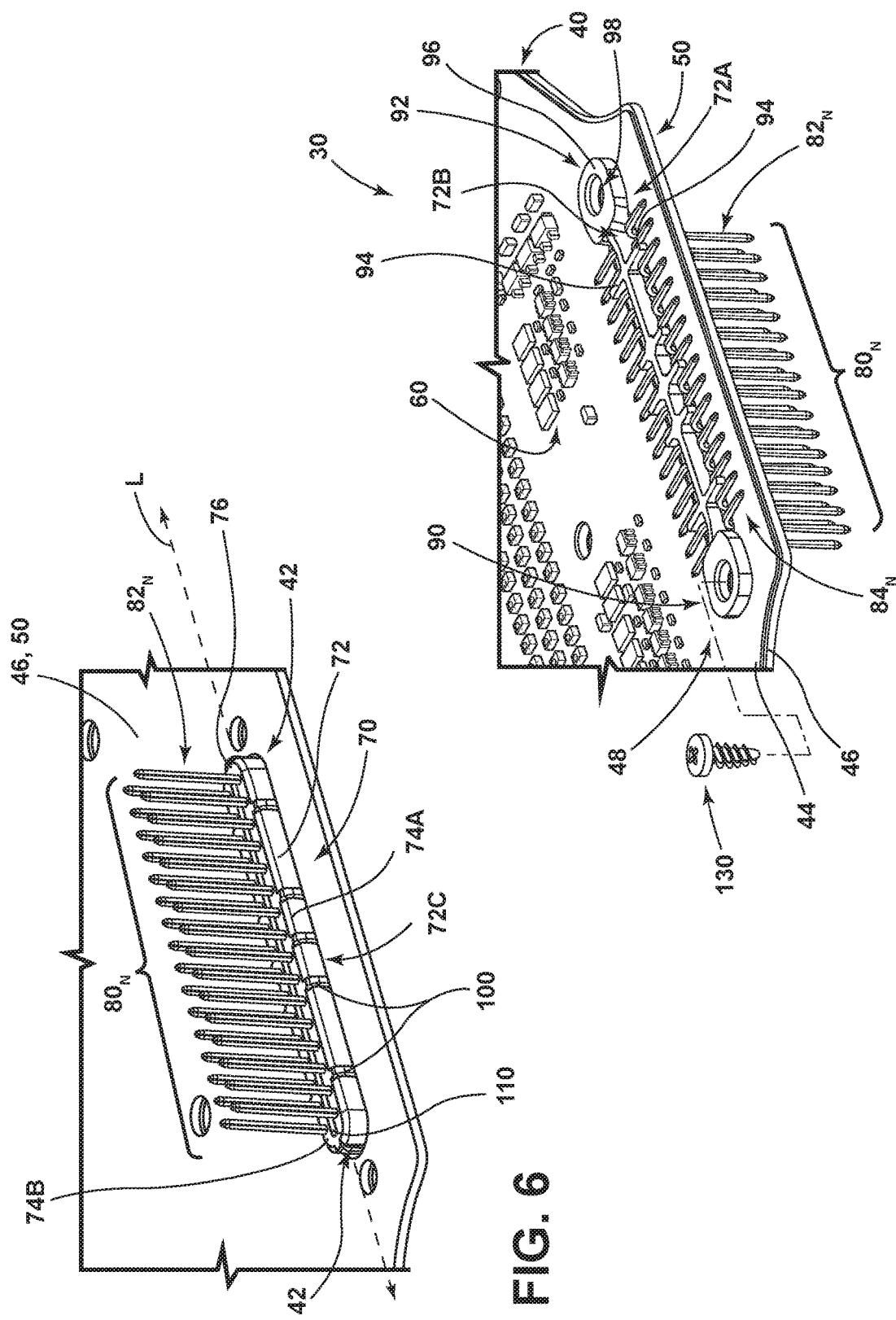

CIRCUIT BOARD ASSEMBLY

CROSS-REFERENCE TO RELATED APPLICATIONS

This application claims the benefit of German Utility Model Application No. 202016105563.6 filed on Oct. 6, 2016 now German Utility Model 202016105563U, registered on Feb. 2, 2017, the disclosure of which is hereby incorporated herein by reference in its entirety.

TECHNICAL FIELD

The present disclosure relates to electrical components, including circuit boards, electrical connectors, electrical terminals/pins, and/or headers.

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

Conventional terminal headers may be configured as surface mount devices (SMDs). In certain applications, such as, for example, temperature sensitive applications (e.g., LED headlamp circuit boards), insulated metal substrate (IMS) circuit boards may not be compatible with certain SMD headers and/or insertion pins.

SUMMARY

The present disclosure includes a circuit board assembly that may comprise a circuit board that may include an aperture and/or a reverse header. The reverse header may include a base and/or a plurality of pins connected to the base. A portion of each of the plurality of pins may be disposed at least partially in the aperture. The circuit board may comprise an insulated metal substrate circuit board. At least one pin of the plurality of pins may include a board connection portion and/or a connector connection portion. The board connection portion may be connected to a first side of the circuit board and/or the connector connection portion may extend through the aperture and beyond a second side of the circuit board. The connector connection portion may be configured for connecting with a connector independent of flexible cables. The first side of the circuit board may include at least one of a thin layer of foil and a thin layer structure. The thin layer structure may comprise FR4. Each of the plurality of pins may be electrically connected to a first side of the circuit board and/or each of the plurality of pins may extend through the aperture and beyond a second side of the circuit board. The second side of the circuit board may include a layer that may comprise at least one of copper and aluminum. The reverse header may electrically insulate the board connection portion from direct connection with the layer of copper. The connector connection portion may be substantially perpendicular to the circuit board.

In embodiments, the base may include a plurality of feet that may be connected to a first side of the circuit board. At least one of the plurality of feet may include an aperture that may be configured to receive a fastener. A first foot of the plurality of feet may be disposed at a first end of the base and/or a second foot of the plurality of feet may be disposed at a second end of the base. The first foot and the second foot may be of a first type and/or the plurality of feet may include feet of a second type. The second type of feet may extend from at least one side of the base. The second type of feet may extend from a first side of the base and from a second side of the base. The first side may be disposed opposite the second side. The plurality of feet may include a first type of feet and a second type of feet. The base may include a first portion disposed at a first side of the circuit board, a second portion disposed in the aperture, and/or a third portion disposed at a second side of the circuit board. The base may extend from a first side of the circuit board through the aperture and beyond a second side of the circuit board. The base may include a generally oblong shape. The base may include a plurality of ribs that may be disposed substantially perpendicularly to the circuit board. The plurality of pins may include a first row of pins and/or a second row of pins. The base may include an elongated recess disposed between the first row of pins and the second row of pins.

BRIEF DESCRIPTION OF THE DRAWINGS

FIG. 1A is an enlarged perspective view of portions of the circuit board assembly of FIG. 1.

FIGS. 2A and 2B are an enlarged perspective views of portions of the circuit board assembly of FIG. 2.

FIGS. 6-9 are perspective views of portions of embodiments of circuit boards and reverse headers in accordance with teachings of the present disclosure.

DETAILED DESCRIPTION

Figure 1:
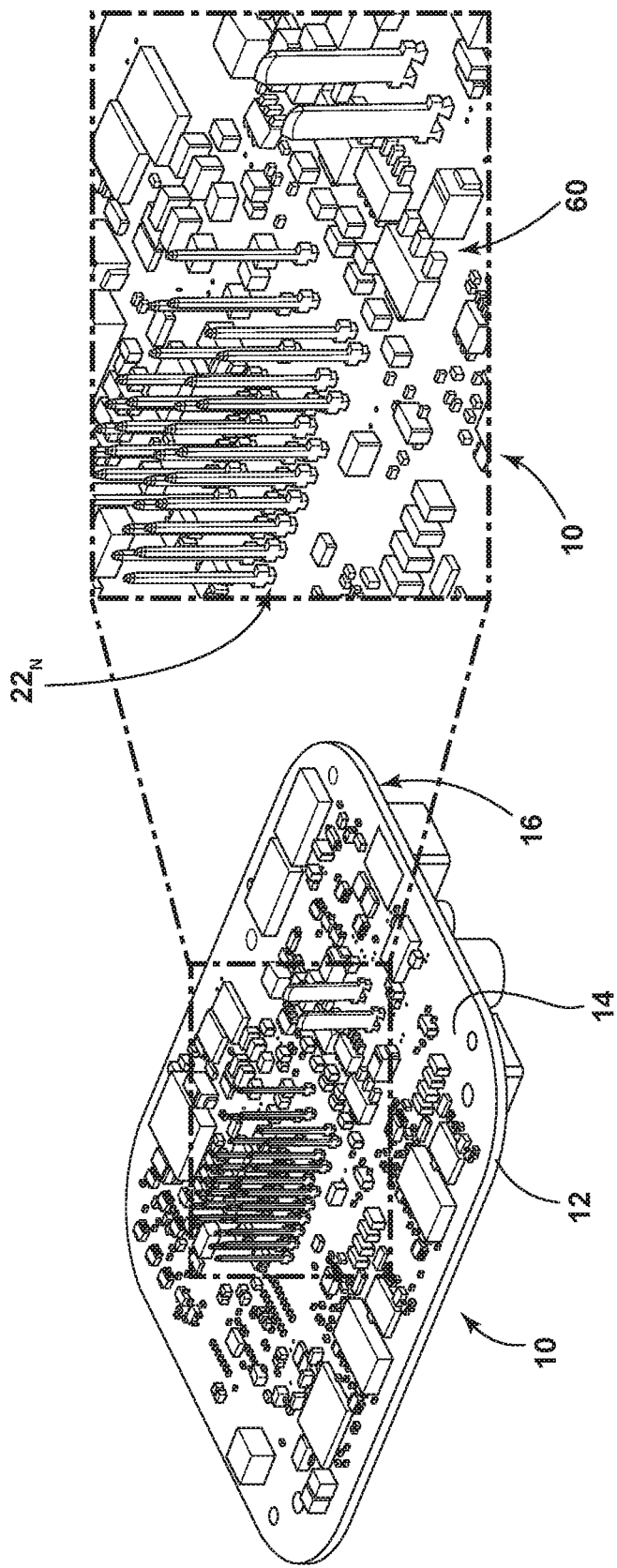
FIG. 1 is a perspective view of portions of an embodiment of a circuit board assembly.
Figure 2:
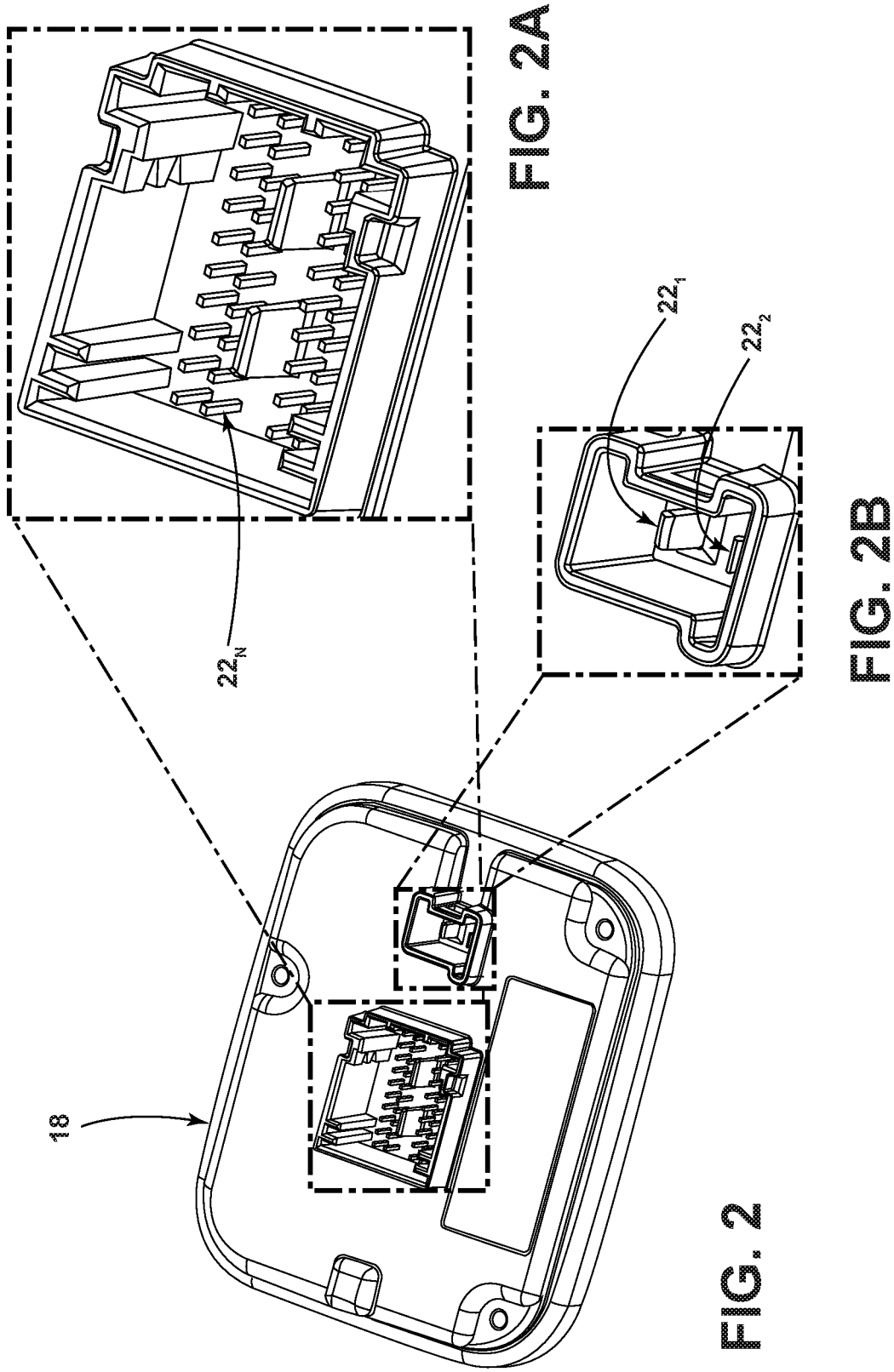
FIG. 2 is a perspective view of a portion of an embodiment of a circuit board assembly.
Figure 3:
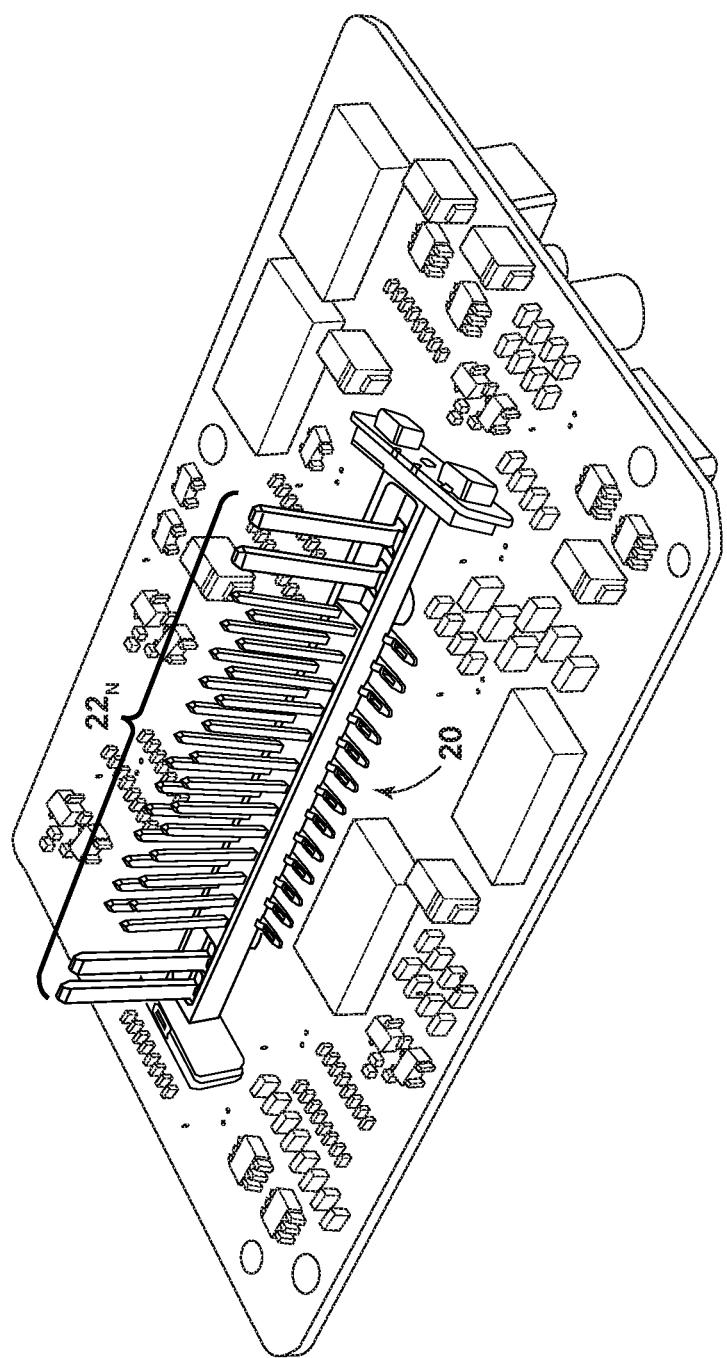
FIG. 3 is a perspective view of portions of an embodiment of a header.
Figure 4:
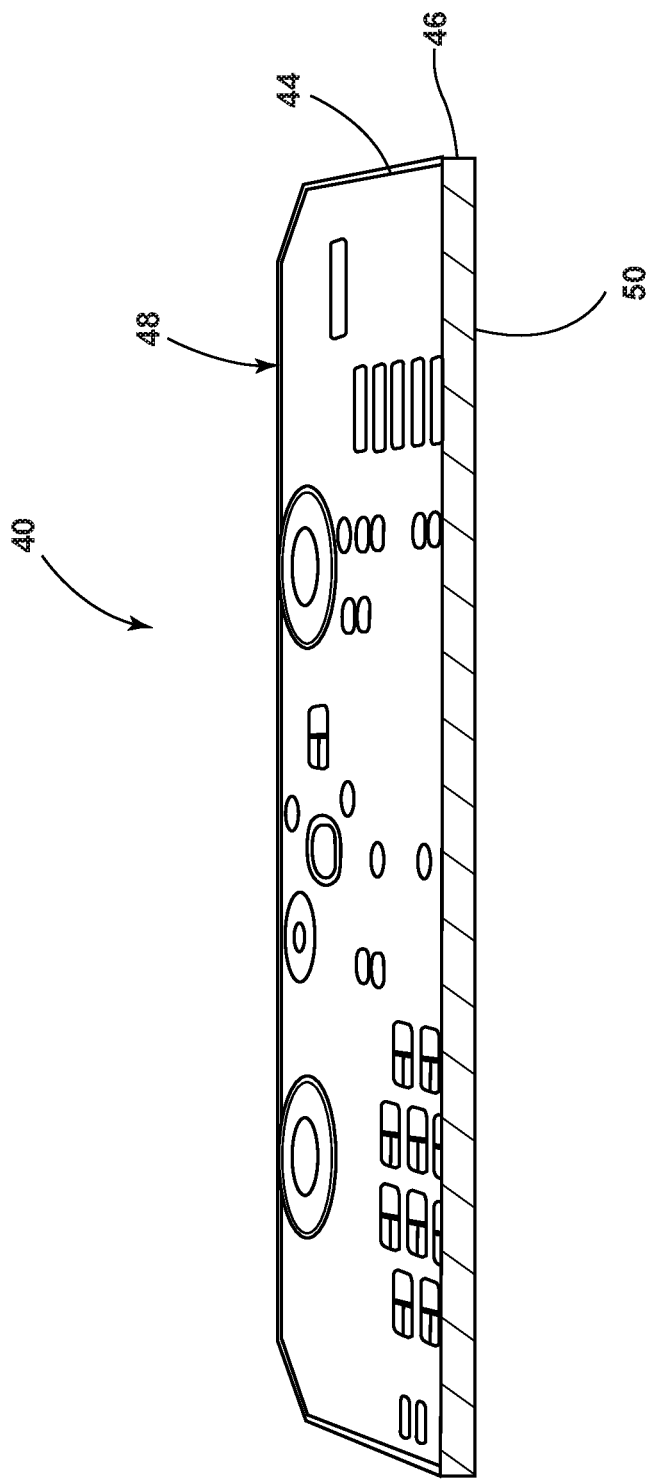
FIG. 4 is a perspective view of portions of an embodiment of an insulated metal substrate circuit board in accordance with teachings of the present disclosure.

Reference will now be made in detail to embodiments of the present disclosure, examples of which are described herein and illustrated in the accompanying drawings. While the disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure.

In embodiments, such as generally illustrated in FIGS. 1, 1A, 2, 2A, 2B, and 3, a circuit board assembly 10 may include a circuit board 12, a cover/housing 18, a header 20, and/or a plurality of terminals/pins $22_N$. In some applications, the pins $22_N$ may be fixed directly to circuit board 12 (see, e.g., FIGS. 1 and 1A) and may extend through cover 18, such as to connect with a connector (e.g., of a wiring harness). In other applications, pins $22_N$ may be connected to circuit board 12 via header 20 (see, e.g., FIG. 3). Header 20 may be connected to a first side/surface 14 of circuit board 12 and pins $22_N$ may also be connected to first side 14 of circuit board 12. Pins $22_N$ may extend outward from one of two sides 14, 16, generally perpendicular to circuit board 12.

In embodiments, such as generally illustrated in FIGS. 4, 5, 6, 7, 8, 9, 10, 11A, and 11B a circuit board assembly 30 may include a circuit board 40 (e.g., a printed circuit board, PCB) that may include, for example, an insulated metal substrate (IMS) configuration. Circuit board 40 may be referred to herein as IMS circuit board 40 and/or IMS board 40, but circuit board 40 is not limited to an IMS-type board. An IMS circuit board 40 may include a layer of foil 44 and/or a conducting layer 46 (e.g., a copper layer, an aluminum layer, a gold layer, etc.). Foil layer 44 may be disposed at a first side 48 of circuit board 40 and/or conducting layer 46 may be disposed at a second side/surface 50 of circuit board 40. First side 48 and/or foil layer 44 may be configured for connection with electrical components 60, and second side 50 and/or conducting layer 46 may or may not be configured for connection with electrical components 60. In embodiments, second side 50 may not be configured for connection with electrical components 60, so, in such embodiments, all electrical components 60 physically connected to circuit board 40 may be connected via first side 48. While embodiments of circuit board 40 are described in connection with an IMS circuit board, embodiments of circuit board 40 may include a conventional configuration (e.g., FR-4).

Figure 5:
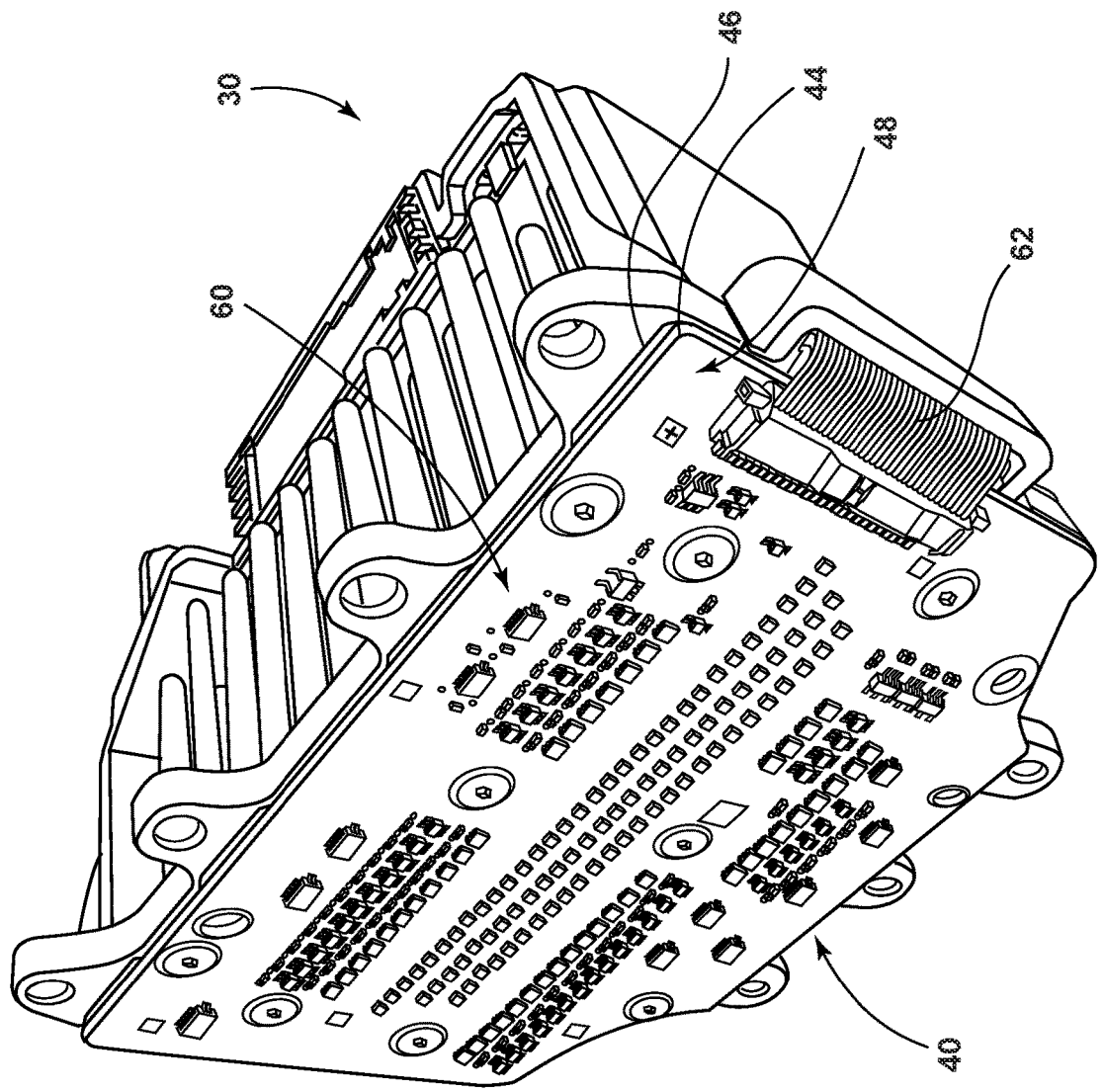
FIG. 5 is a perspective view of portions of an embodiment of an insulated metal substrate circuit board in accordance with teachings of the present disclosure.
Figure 8:
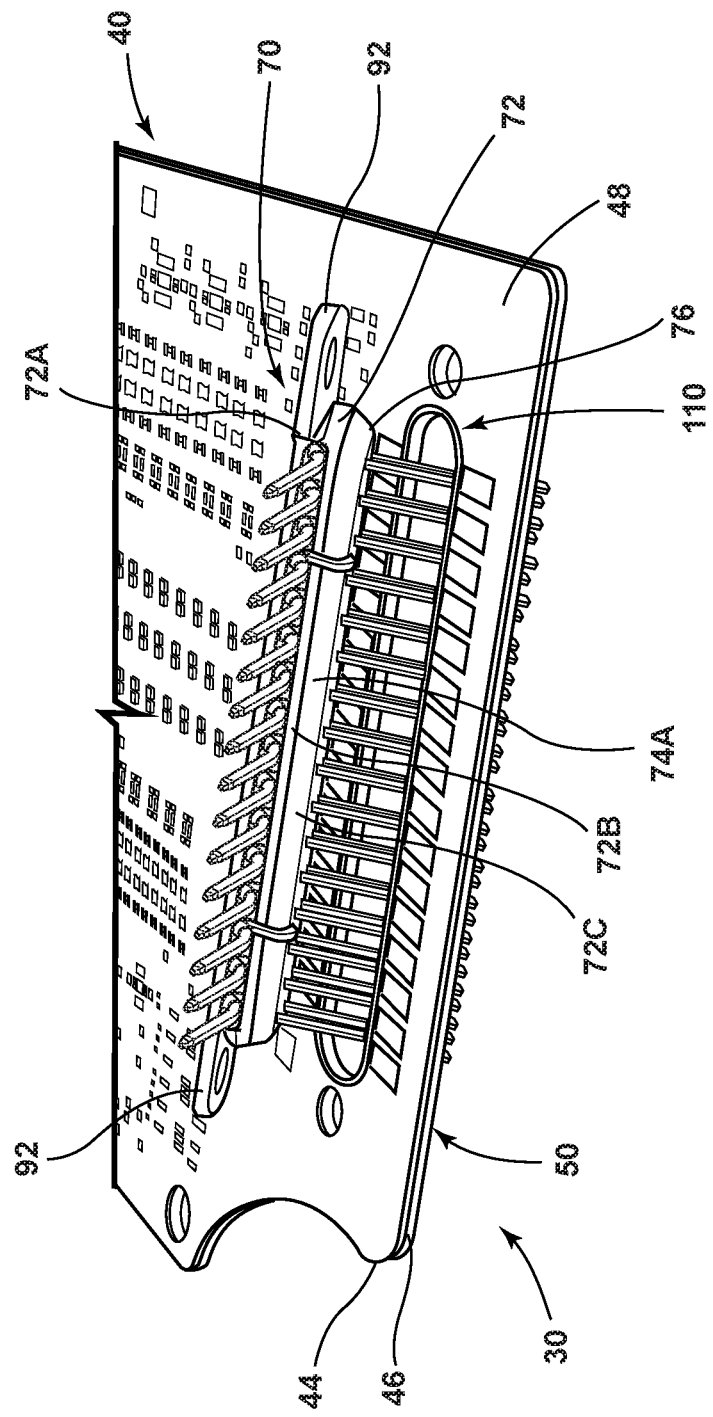
Figure 9:
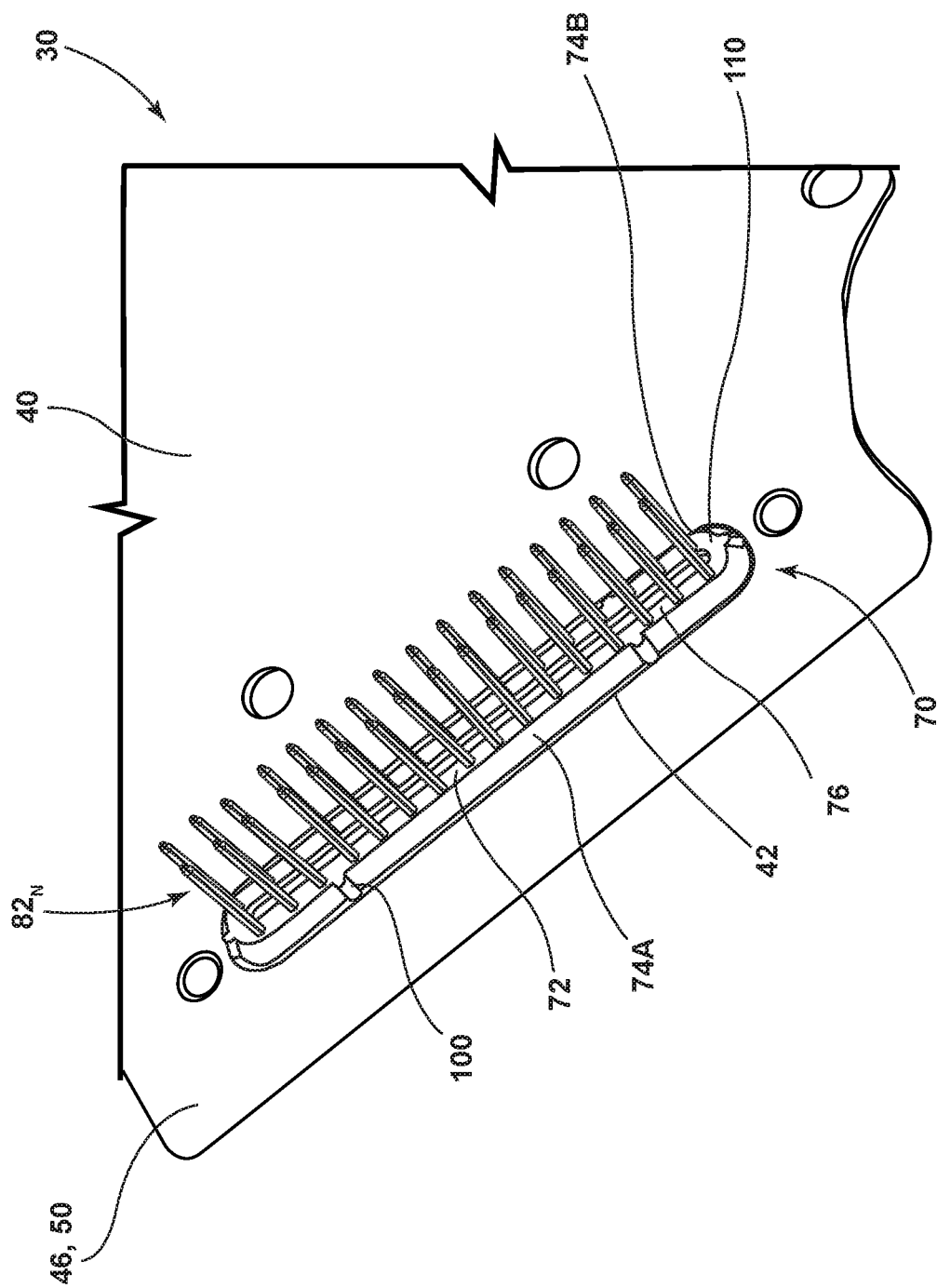
Figure 10:
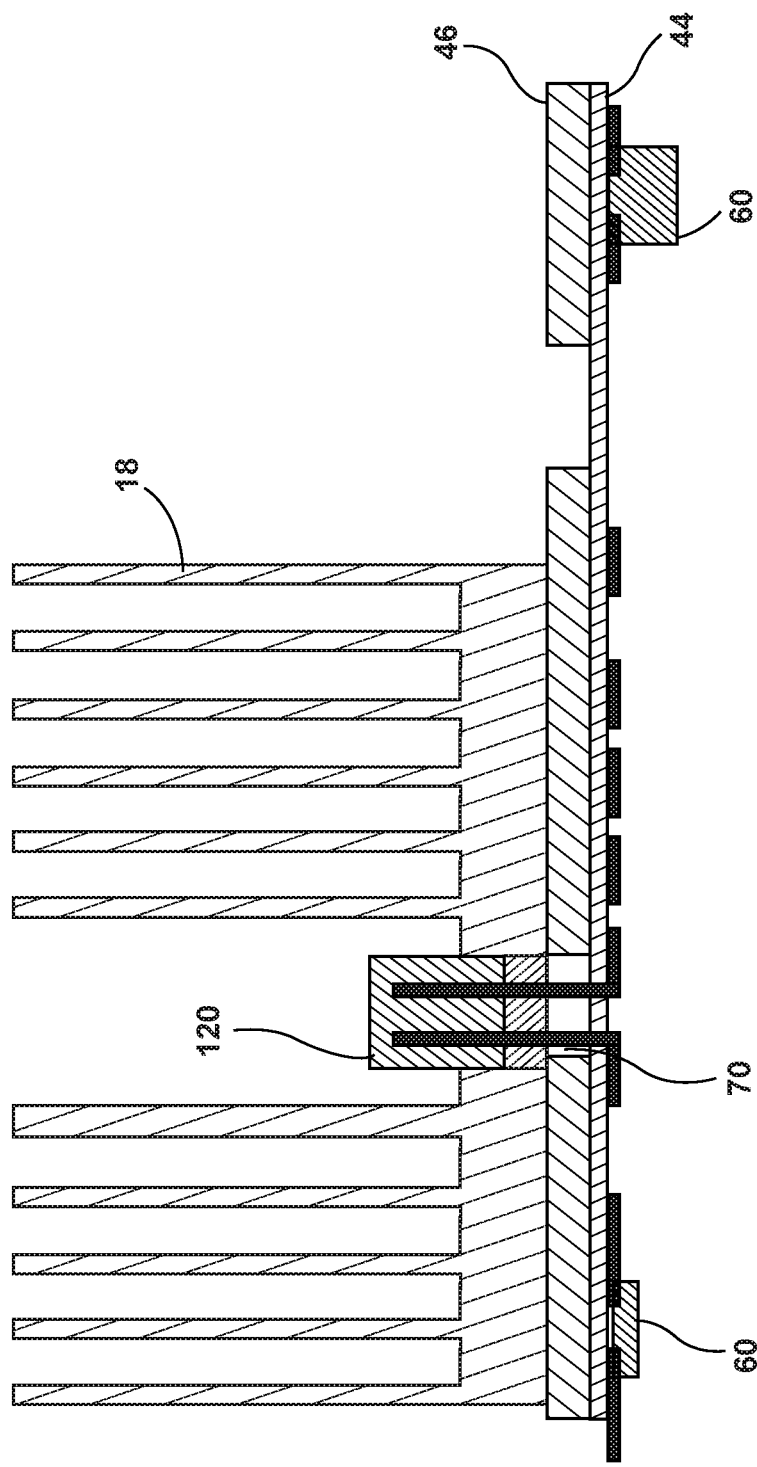
FIG. 10 is a cross-sectional view of an embodiment of a circuit board assembly in accordance with teaching of the present disclosure.

With embodiments, such as generally illustrated in FIG. 5, electrical components 60 may be physically connected to first side 48 of circuit board and may be connected to a flexible cable 62 for connections at second side 50 of circuit board 40. Flexible cables 62 may be relatively expensive.

With embodiments, foil layer 44 may be relatively thin. For example, and without limitation, foil layer 44 may be about 0.2 mm thick (see, e.g., FIG. 10). If foil layer 44 is relatively thin, foil layer 44 may be compatible with connecting a limited number or type of electrical components 60. For example, and without limitation, in some instances, foil layer 44 may not provide sufficient structural support for direct connection with press fit pins (e.g., pins $22_1$, $22_2$). In embodiments, layer 44 may include a thin layer structure (e.g., FR4).

Figure 11A:
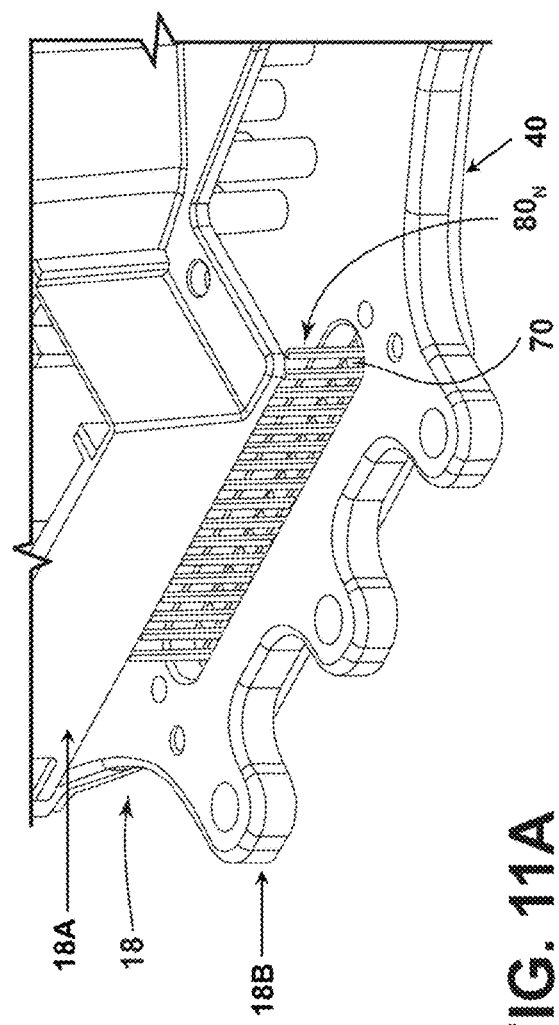
FIGS. 11A and 11B are perspective views of portions of embodiments of circuit boards and reverse headers in accordance with teachings of the present disclosure.
Figure 11B:
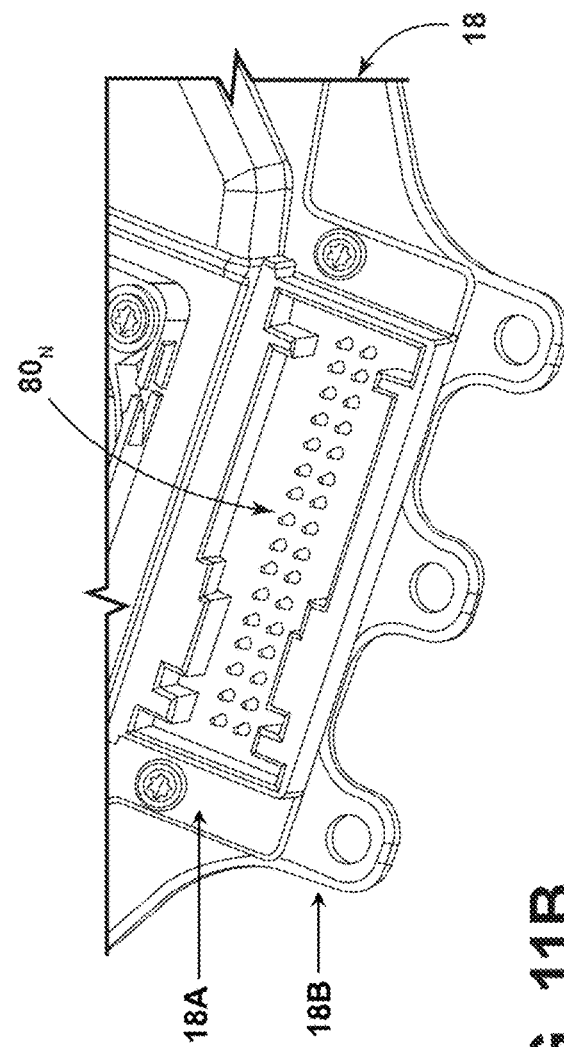

In embodiments, such as generally illustrated in FIGS. 6-11B, circuit board assembly 30 may include a reverse header 70. Reverse header 70 may, for example, be configured to facilitate connection of terminals/pins $80_N$ with first side 48 of circuit board 40 such that the pins $80_N$ are provided for connection with a connector 120 at second side 50 of circuit board 40. As shown in FIGS. 11A and 11B, housing 18 may include a first portion 18A and a second portion 18B that may be configured for connection with first portion 18A. Pins 80N may be configured to extend through the first portion 18A and the second portion 18B.

In embodiments, pins $80_N$ may include one or more of a variety of shapes, sizes, configurations, and/or materials. For example, and without limitation, pins $80_N$ may include a conducting metal and/or may include a generally L-shaped configuration. An L-shaped configuration may correspond to a pin $80_N$ including a vertical portion $82_N$ and/or a horizontal portion $84_N$. A horizontal portion $84_N$ may extend laterally outward from a base 72 of reverse header 70 (e.g., perpendicular to base 72, parallel with circuit board 40), may be configured to electrically connect with circuit board 40, and/or may be referred to herein as a board connection portion $84_N$. A vertical portion $82_N$ may extend through base 72, through circuit board 40 (e.g., through aperture/slot 42), may extend outward from a top 76 of base 72 (e.g., perpendicular to base 72 and circuit board 40) for connection with a connector 120, and/or may be referred to herein as a connector connection portion $82_N$.

With embodiments, reverse header 70 may include one or more of a variety of shapes, sizes, configurations, and/or materials. For example, and without limitation, reverse header may include a base 72 that include a generally elongate/oblong shape (e.g., a rectangular shape with rounded corners/ends, an oval shape, etc.) that may correspond to a shape of a corresponding aperture/slot in circuit board (e.g., slot 42). As generally illustrated in FIG. 7, for example, one or more feet 90 may be connected to and/or included with base 72. The one or more feet may include a first type 92 and/or a second type 94. A first type 92 may be configured for connecting and/or securing reverse header 70 to circuit board 40. For example, and without limitation, first type 92 may extend laterally outward from base 72 and may include a securing portion 96 that may be configured to at least partially receive a fastener 130 (e.g., a screw, bolt, rivet, etc.). The securing portion 96 may include, for example, an aperture 98. In embodiments, reverse header 70 may include a pair of feet of the first type 92 that may be disposed at/extend from opposite ends of reverse header 70 (e.g., parallel with a longitudinal direction L of reverse header 70).

A second type of feet 94 may extend laterally outward from one or more sides 74A, 74B of base 72 (e.g., perpendicular to longitudinal direction L). For example, and without limitation, a first set of second type of feet may extend from a first side 74A of base 72 and a second set of second type of feet may extend from a second, opposite side 74B of base 72. The length of second type of feet may vary along first side 74A and/or along second side 74B. Second type of feet 94 may be disposed between horizontal portions $84_N$ of pins 80. The first type of feet 92 and/or the second type of feet 94 may limit and/or restrict the insertion distance of reverse header 70 into circuit board (e.g., into aperture/slot 42).

With embodiments, reverse header 70 may include one or more projections/ribs 100 that may extend from base 72. Ribs 100 may be disposed generally vertically (e.g., perpendicular to circuit board 40) and/or may be configured to contact and/or engage circuit board 40. Top 76 of base and/or ribs 100 may be tapered to facilitate insertion of reverse header 70 into circuit board 40 and/or to restrict movement of reverse header 70 once inserted. For example, ribs 100 may provide an interference fit between reverse header 70 and circuit board 40.

In embodiments, pins $80_N$ may be disposed in one or more rows. For example, and without limitation, pins $80_N$ may be disposed in a first row and a second row. The first and second rows may include the same or different numbers of pins. The first and second rows may include, for example, about sixteen pins each. Base 72 may include a recess/slot 110 that may be disposed between the first row and the second row, and may extend along part or all of the first and second rows.

With embodiments, a method of assembling circuit board assembly 30 may include providing a circuit board 40, which may be configured as an IMS board. Circuit board 40 may include an aperture 42 (e.g., an elongated slot may be formed in circuit board 40). Pins $80_N$ may be inserted into a base 72 of a reverse header 70 and/or base 72 may be formed around pins $80_N$. Reverse header 70 may then be inserted through a first side 48 of circuit board 40 into aperture 42 and reverse header 70 may continue to be inserted until one or more feet (e.g., feet 92, 94) contact first side 48 of circuit board 40. Once reverse header 70 has been inserted, a first portion 72A of base 72 may extend beyond first side 48, a second portion 72B of base 72 may be disposed within aperture 42, and/or a third portion 72C of base 72 may extend beyond second side 50 of circuit board 40. Horizontal portions $84_N$ of pins $80_N$ may be electrically and/or physically connected to first side 48 of circuit board 40. Vertical portions $82_N$ of pins $80_N$ may extend beyond (e.g., vertically/perpendicularly) second side 50 and/or may be configured for connection with a connector 120.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "embodiments," "one embodiment," or "an embodiment," or the like, means that a particular feature, structure, or characteristic described in connection with the embodiment is included in at least one embodiment. Thus, appearances of the phrases "in various embodiments," "in embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

It should be understood that references to a single element are not so limited and may include one or more of such element. All directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

What is claimed is:

1. A circuit board assembly, comprising:
   a circuit board including an aperture;
   a reverse header, including:
      a base; and
      a plurality of pins connected to the base; and
   a housing configured to at least partially cover the circuit board;
   wherein a portion of each of the plurality of pins is disposed at least partially in the aperture, the base includes one or more ribs configured to provide an interference fit between the reverse header and the aperture of the circuit board; each pin of the plurality of pins includes a board connection portion electrically connected to the circuit board; the plurality of pins extend through the housing; and the base extends from a first side of the circuit board through the aperture and beyond a second side of the circuit board.

2. The circuit board assembly of claim 1, wherein the circuit board comprises an insulated metal substrate circuit board.

3. The circuit board assembly of claim 1, wherein each the plurality of pins includes a connector connection portion, and the connector connection portion extends through the aperture, beyond the second side of the circuit board, and beyond the base.

4. The circuit board assembly of claim 1, wherein the one or more ribs are tapered to facilitate insertion of the reverse header into the aperture.

5. The circuit board assembly of claim 4, wherein the one or more ribs includes a first rib extending from a first longitudinal end of the base, a second rib extending from a second longitudinal end of the base, a first plurality of ribs extending from a first lateral side of the base, and a second plurality of ribs extending from a second lateral side of the base.

6. The circuit board assembly of claim 3, wherein the first side of the circuit board includes at least one of a thin layer of foil and a thin layer structure comprising FR4.

7. The circuit board assembly of claim 1, wherein the plurality of pins are male pins.

8. The circuit board assembly of claim 1, wherein the housing includes a first portion and a second portion configured for connection with the first portion; and the plurality of pins extend beyond the base through the first portion and through the second portion.

9. The circuit board assembly of claim 3, wherein the second side of the circuit board includes a layer comprising at least one of copper and aluminum; and the reverse header electrically insulates the board connection portion from direct connection with the layer.

10. The circuit board assembly of claim 3, wherein the connector connection portion is substantially perpendicular to the circuit board.

11. The circuit board assembly of claim 1, wherein the base includes a plurality of feet connected to the first side of the circuit board.

12. The circuit board assembly of claim 11, wherein at least one of the plurality of feet includes an aperture configured to receive a fastener.

13. The circuit board assembly of claim 11, wherein a first foot of the plurality of feet is disposed at a first end of the base and a second foot of the plurality of feet is disposed at a second end of the base.

14. The circuit board assembly of claim 13, wherein the first foot and the second foot are of a first configuration and the plurality of feet includes feet of a second configuration.

15. The circuit board assembly of claim 14, wherein the second configuration of feet extend from a first side of the base and from a second side of the base, the first side disposed opposite the second side; and the feet of the second configuration include feet of different lengths.

16. The circuit board assembly of claim 1, wherein the base includes a first portion disposed at the first side of the circuit board, a second portion disposed in the aperture, and a third portion disposed at the second side of the circuit board.

17. The circuit board assembly of claim 1, wherein the base includes a generally oblong shape with rounded corners and the aperture includes a corresponding oblong shape with rounded corners.

18. The circuit board assembly of claim 1, wherein the one or more ribs extend to a top of the base; and the top of the base is disposed beyond the second side of the circuit board.

19. The circuit board assembly of claim 3, wherein the plurality of pins includes a first row of pins and a second row of pins; and a top of the base includes an elongated recess disposed between the first row of pins and the second row of pins; the elongate recess extends along all of the first row of pins and the second row of pins; and the top of the base is disposed beyond the second side of the circuit board.

* * * * *